United States Patent [19]

Barrett et al.

[11] 4,001,673
[45] Jan. 4, 1977

[54] METHOD OF TESTING AND REPAIRING MAGNETIC BUBBLE DOMAIN CHIP

[75] Inventors: Gerald George Barrett, San Jose, Calif.; Louis Michael Hornung; Calvin Coolidge Jones, Jr., both of Austin, Tex.

[73] Assignee: International Business Machines Corporation, Armonk, N.Y.

[22] Filed: June 30, 1975

[21] Appl. No.: 591,421

[52] U.S. Cl. .................. 324/34 R; 340/174 TF; 340/174 TC
[51] Int. Cl.² ................................. G01R 33/12
[58] Field of Search ........... 324/34 R; 340/174 TF, 340/174 TC

[56] References Cited
UNITED STATES PATENTS

| | | | |
|---|---|---|---|
| 3,792,450 | 2/1974 | Bogar et al. | 340/174 CL |
| 3,921,156 | 11/1975 | Yoshimi | 340/174 TF |

Primary Examiner—Robert J. Corcoran
Attorney, Agent, or Firm—James H. Barksdale, Jr.

[57] ABSTRACT

A method of both testing all loops of a long serial magnetic bubble domain chip, and repairing the chip for automatic bypass of defective loops. Each repair station associated with each loop is sequentially loaded with a bubble domain. Then new domains are sequentially generated and positioned adjacent each loop. The domains initially loaded into the repair stations are shifted out in parallel for propagation along the loops. The new domains are then loaded in parallel into the repair stations. The domains propagated along the loops are read to determine defective loops, and form a basis for generating a repair pattern. The repair pattern is then loaded in parallel into the repair stations for sealing off defective loops.

9 Claims, 6 Drawing Figures

1. ALL 1'S PATTERN LOADED, READY TO WRITE PERSONALIZED PATTERN.

2. SHIFT PATTERN INTO POSITION 110.

3. PULSE ALL 1'S PATTERN OUT.

4. SHIFT NEW PATTERN IN

METHOD OF TESTING AND REPAIRING MAGNETIC BUBBLE DOMAIN CHIP

CROSS-REFERENCE TO RELATED APPLICATION

U.S. patent application, Ser. No. 429,415, filed Dec. 28, 1973, having G. S. Almasi as inventor.

BACKGROUND OF THE INVENTION

1. Field of the Invention

This invention relates to redundancy approaches for magnetic bubble domain chips, and more particularly to a method of diagnosing and repairing a magnetic bubble domain chip.

2. Description of the Prior Art

Complete magnetic bubble domain systems including read, write and storage functions are known in the art as evidenced by U.S. Pat. No. 3,701,124. In the instant application, a magnetic "chip" will be defined as a magnetic bubble domain medium capable of supporting magnetic bubble domains therein, together with associated circuitry for providing routine functions (such as read, write and storage) in the magnetic bubble domain medium.

Calculations have been made which indicate that, for bubble domain bit capacities greater than $10^5$ bits, the yield of perfect chips begins to decrease rapidly. Thus, an approach which would allow a magnetic chip with a small number of malfunction areas to repair itself and remain operational would be of significant value. In the prior art, copending application Ser. No. 249,026, filed May 1, 1972, now abandoned describes a magnetic bubble domain system having redundancy. In that application, on-chip redundancy is provided using spare storage units as well as units which give a spare storage unit the personality of a faulty storage unit to be replaced. Specifically, structure is provided to physically remove connections in order to substitute a spare storage unit (such as a shift register) for a faulty storage unit. The spare storage units are provided with spare decoders as well as spare sensing means.

Other known prior art consists of U.S. Pat. No. 3,792,450 to Bogar et al. The structure involved in this patent comprises a magnetic bubble domain chip utilizing a major/minor loop configuration. Defective minor loops are determined by the absence of emerging bubble domains which are in turn utilized to create a program on a separate loop. This program is then used to determine which minor loops are to be used. Considerable structure and control, as well as a dedicated loop, are required. Further, entrance of domains into defective loops is not otherwise inhibited. Should a defect exist in the program, then stored data will become worthless.

The present invention differs from the prior art and the above cross-referenced application in that dynamic testing procedures can be used to provide a defect-tolerant magnetic chip in a very short time.

SUMMARY OF THE INVENTION

In accordance with this invention, the testing of all loops of a long serial magnetic bubble domain chip, for detecting defects, is accomplished by first sequentially generating bubble domains. Repair stations are located adjacent the entrance and exit of each loop. The bubble domains sequentially generated are loaded into each repair station for creating shorting paths between the loops. New domains are then sequentially generated and positioned adjacent each repair station. Thereafter, the domains in the repair stations are shifted out and along the loops in parallel. When shifted out, the new domains are loaded into the repair stations in parallel. The domains in the loops are shifted until they encounter the repair stations. Since the repair stations contain domains, propagation down a subsequent loop is inhibited. Thus, these domains shift down shorting paths bridging the entrance and exit of each loop, and are read or sensed. If one of the loops is defective, a void will exist and be sensed. The arrangement of domains and voids read will provide the basis for a repair pattern for repairing the chip. The repair pattern will be a logical compliment of the pattern read. The repair pattern is sequentially generated and properly positioned adjacent the loops. The domains in the repair stations are then shifted out in parallel for propagation along the loops. The repair pattern is then loaded into the repair stations in parallel.

DESCRIPTION OF THE PREFERRED EMBODIMENT

Figure 1:
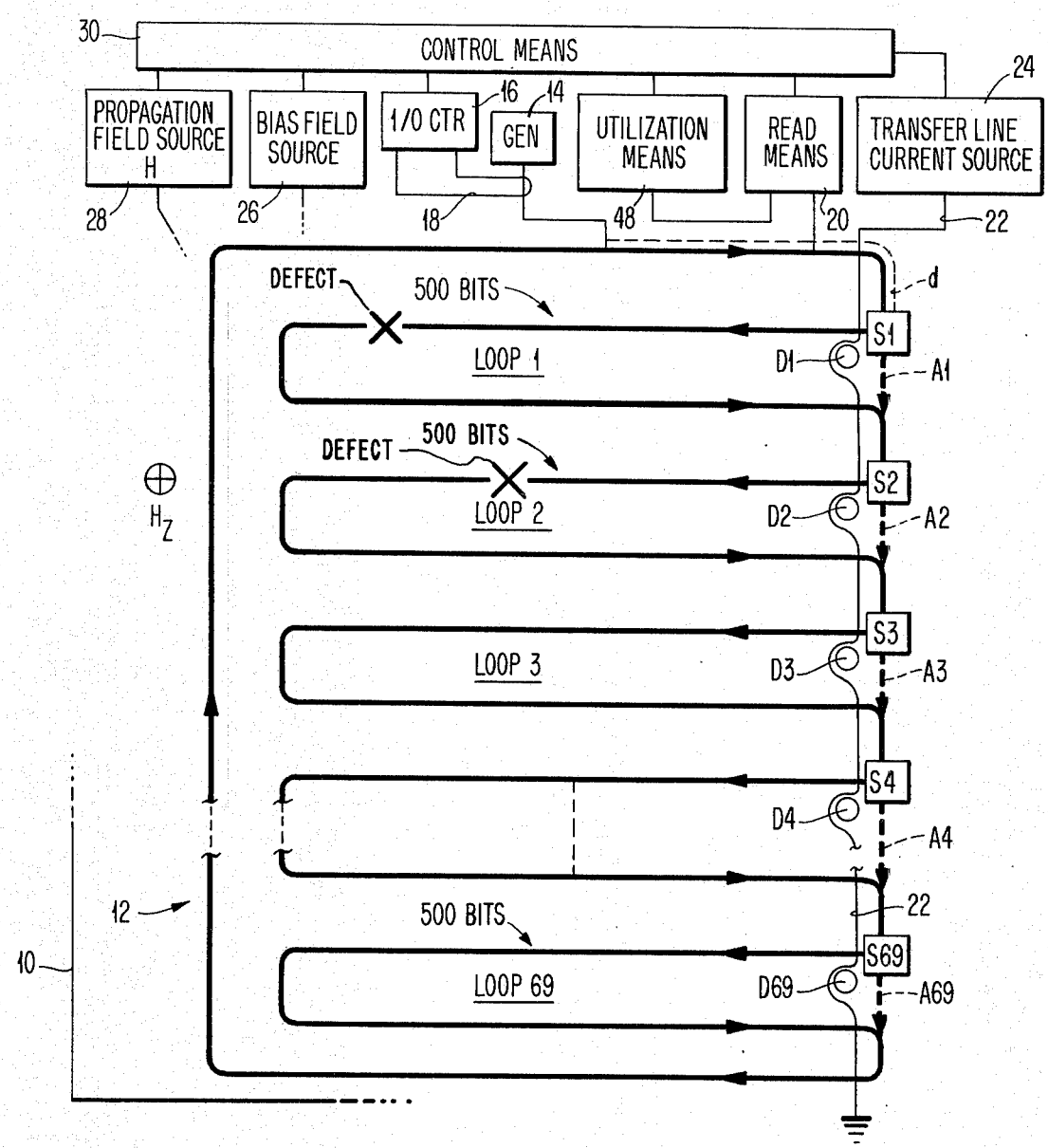
FIG. 1 is a schematic illustration showing a memory chip having means associated therewith for improving the yield of the chip.

FIG. 1 shows a magnetic bubble domain chip comprising a bubble domain medium 10 in which magnetic bubble domains exist and can be propagated. For instance, bubble domain material 10 can be made up of any known magnetic bubble domain material such as garnets, amorphous magnetic materials, etc. A plurality of bubble domain storage positions is provided, which positions are arranged in the various loops 1, 2, . . . 69 of a long serial shift register 12. The propagation path for domains in the shift register is indicated by the heavy lines having arrows thereon. As is well known, structures for moving magnetic bubble domains in the medium 10 include various magnetically soft structures as well as ion implanted regions in magnetic medium 10. For the practice of this invention, any type of propagation structure can be used for moving and storing domains in medium 10.

A write means for producing magnetic bubble domains in medium 10 is comprised of a bubble domain generator 14 and a I/O control 16. The I/O control 16 includes a current source and a current carrying loop 18 which crosses the propagation path of bubble domains from generator 14 to shift register 12. Control 16 provides current pulses in loop 18 which collapse domains produced by generator 14. In this manner, a pattern of bubbles and voids can be produced which can be used, for instance, to represent binary information in register 12. As will be understood by those of skill in the art, any type of domain coding can be used to provide domains having different properties which represent information.

A read means 20 is used to detect domains in shift register 12. In a preferred embodiment, the read means can comprise a magneto-resistive sensing element as is shown in U.S. Pat. No. 3,691,540. In addition to magneto-resistive sensing, any other type of domain sensing can be utilized, as is known in the art.

Shift register 12 is illustratively shown as having a plurality of storage loops 1, 2, ... 69, five of which are surplus. In the preferred embodiment contemplated herein, the fully operational shift register will have 64 operating storage loops, and will be capable of storing in excess of 32K bits.

Associated with each of the loops of the shift register 12 is structure for rerouting bubble domains if there is a defect in any particular shift register loop. The rerouting structure is comprised of a switch and a means for controlling the switch to provide a preferred direction of bubble domain movement through the switch. That is, bubble domains entering the switches can follow one of two paths depending upon the application of the switch controls.

The switches at the beginning of each shift register loop are labelled S1 (for the first loop), S2 (for the second loop), ... S69 (for the sixty-ninth loop).

The means for determining the preferred path of bubble domains through the switches S1, S2, ... comprise means for holding a bubble domain, together with a current carrying transfer line 22. Transfer line 22 is connected to a transfer line current source 24. The means for holding domains are conveniently shown as discs D1, D2, ... D69, which can be comprised of any magnetically soft material such as permalloy. When a magnetic bubble domain travelling along the path of the shift register is in an appropriate position adjacent to transfer line 22, a current pulse in that line will move the domain to a disc where it will remain during further propagation cycles. The presence or absence of a trapped domain determines the path of movement of subsequent bubble domains through the various switches S1, S2, ...

A bias field source 26 provides a stabilizing bias field $H_z$ normal to the plane of bubble domain medium 10. Source 26 can be any of a number of well known means, including current carrying coils and/or permanent magnets adjacent to magnetic medium 10. Propagation field source 28 provides drive pulses which are used to move magnetic domains along the shift register 12 and which can be used to generate domains. In the case of propagation structures utilizing magnetically soft materials, the propagation field source 28 will provide a reorienting magnetic field H in the plane of magnetic medium 10. However, any type of propagation means can be used to move domains in the magnetic medium 10 and any type of domain generator can be used.

A control means 30 provides an input to I/O control 16, read means 20, transfer line current source 24, and propagation field source 28. Control means 30 synchronizes the operation of the magnetic chip and regulates the diagnosis and repair of the chip. For instance, control means 30 can be equivalent to that disclosed in copending U.S. patent application Ser. No. 429,415 referred to above.

Under normal conditions, bubble domains produced by the generator 14 are collapsed or not by the I/O control 16 to provide a series of coded bubble domain patterns in the shift register 12. These bubble domains circulate around the shift register and are detected by the read means 20. Under normal conditions with no bubbles on discs D1, D2, ... bubbles in register 12 simply bypass the permalloy discs. Bubble domains entering the switches S1, S2, ... S69 leave these switches following the heavy lines indicating the propagation paths of the shift register 12.

However, when a "forward" current is applied in transfer line 22, a bubble domain in any particular switch is transferred to an adjacent disc. For instance, if a bubble domain is in switch S1, a current pulse in transfer line 22 will create a magnetic field which causes the bubble domain to move to disc D1. The domain will remain there during further cycles of the propagation field H. Each disc D1, D2, ... D69 will be referred to alternately hereinafter as repair station D1, D2, ... D69.

The effect of the trapped bubble domain on a disc is to influence the movement of subsequent bubble domains through an adjacent switch. For instance, a trapped bubble domain on disc D1 will cause subsequent bubble domains coming to switch S1 to be moved along an alternate or shorting path indicated by the dashed line A1. (In a corresponding manner, each loop 1, 2, 3, ... of the shift register 12 has a shorting path A1, A2, A3, ... A69.)

All of the switch-disc combinations are threaded by a single transfer line 22. Generally current (forward or reverse) is applied in this transfer line only while the chip is being tested and repaired. No current is needed in this line during operation of a repaired magnetic chip.

At this stage, it should be noted that switch control could be provided by current carrying switches which send bubble domains in certain paths depending upon whether or not a defect exists in the adjacent loop. However, the use of a trapped bubble domain for controlling the switch provides a technique which involves minimum power dissipation, minimum clocking, and no control means external to the chip. The trapped domain will move around the discs in accordance with the propagation field cycle, and the switch operation will therefore be automatically synchronized with the applied drive fields. Therefore, no additional current pulses are required in the transfer line 22 during actual operation of the magnetic chip.

The diagnosing of problems on the magnetic chip will now be considered. For purposes of illustration, it is assumed that a fully repaired chip consists of a slightly more than 32K bit shift register 12. Shift register 12 is comprised of 64 loops, each of which is 500 bits long plus the peripheral paths $d$ and $e$. The number of bit positions from the generator 14 to the switch S1 is $d$, while the number of bit positions from the final loop back to the beginning of the shift register is $e$.

Initially, generator 14 produces a pattern or chain of bubble domains. The propagation field H is activated and maintained. The first bubble domain will move to switch S1. At this time, a current pulse on the transfer line 22 creates a magnetic field gradient which causes the first bubble domain to be moved to disc D1 where it remains. This will cause the second bubble domain to bypass loop 1 along the shorting path or alternate route A1. The second domain will move to switch S2. Again, a current pulse is applied on transfer line 22 which causes the second domain to be moved to disc D2. This will cause the third domain in the chain to take alternate route A2. In like manner as described above, the third domain will move to switch S3. A current pulse then applied on transfer line 22 will cause the third domain to be moved to disc D3. This operation continues until all discs or repair stations have been sequentially loaded.

The next portion of the testing or diagnostic operation involves continuing the generation of a chain of domains. With each repair station containing a domain, the chain of generated domains will be sequentially propagated along the shorting paths. When a domain has been moved to a position one propagation cycle before the entrance of each of the switches, S1, S2 . . . , a "reverse" current pulse is applied along transfer line 22. This causes the domains located in the repair stations to be propagated in parallel along the loops corresponding to the repair station. On the next propagation cycle, a "forward" pulse is applied along transfer line 22. The domains positioned before the entrance to the switches are then caused to be moved in parallel through the switches and to the corresponding discs. Each loop now has a domain propagating therealong, and each repair station contains a domain. That is, for example, the domain propagating along loop 1 will emerge at the entrance of switch S2. Since disc D2 contains a domain, the domain emerging from loop 1 will follow shorting path A2. Thus, the domains placed on each of the discs serve to send the domains ultimately emerging from the loops through following switches and along the shorting paths.

The domains ultimately emerging from the loops will form another chain which can be read. If no defects exist in any of the loops, then a chain of domains, all present, will emerge indicating no defects. If a defect exists in one of the loops, the domain propagated along that loop will be trapped, and a void will be sensed at the time a domain were expected. The emerging chain, including this void, will provide the basis for repairing the chip in order that the defective loop will be bypassed during use.

Figure 2:
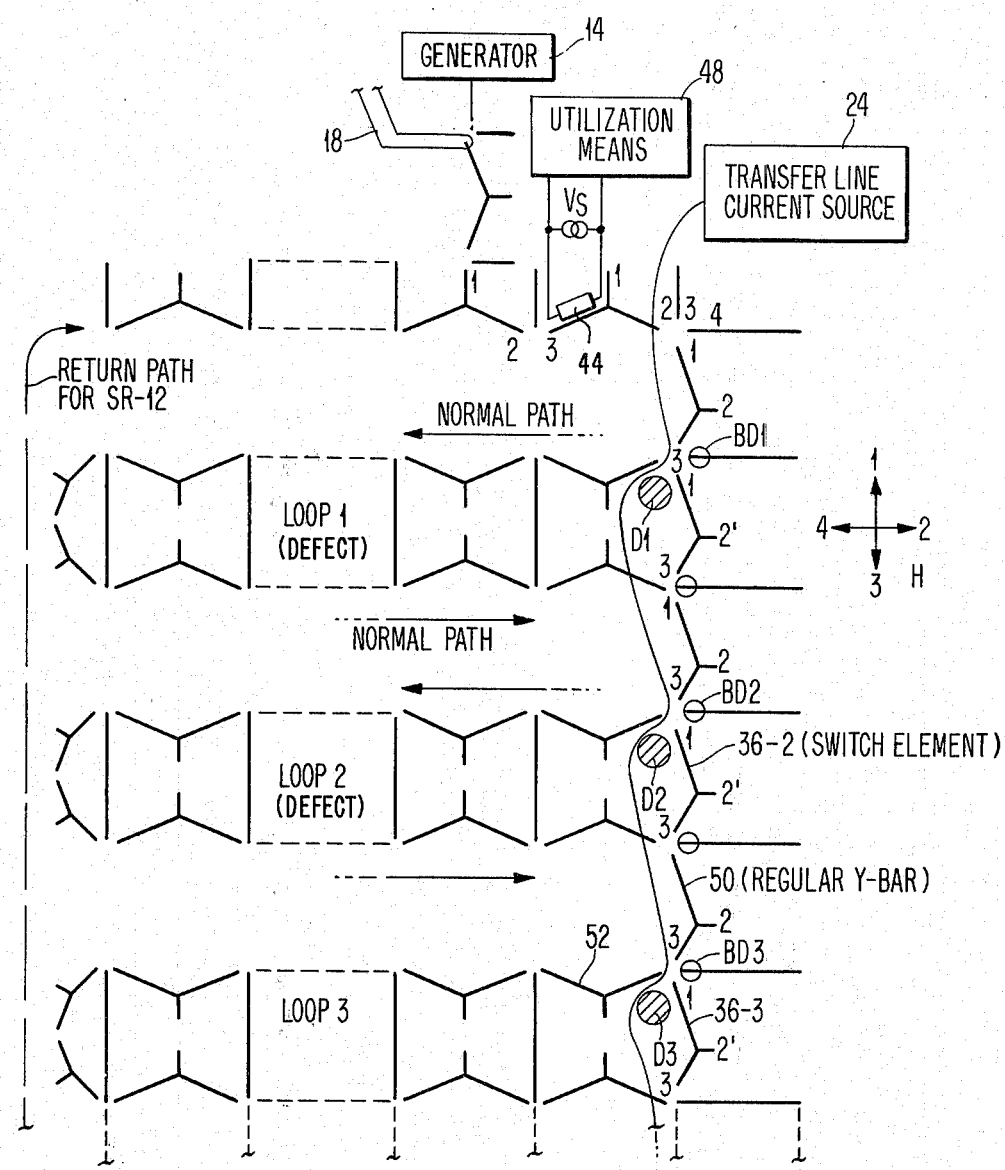
FIG. 2 is a more detailed pictorial representation showing a plurality of storage positions together with switches for routing magnetic bubble domains around defects in the magnetic chip.
Figure 3:
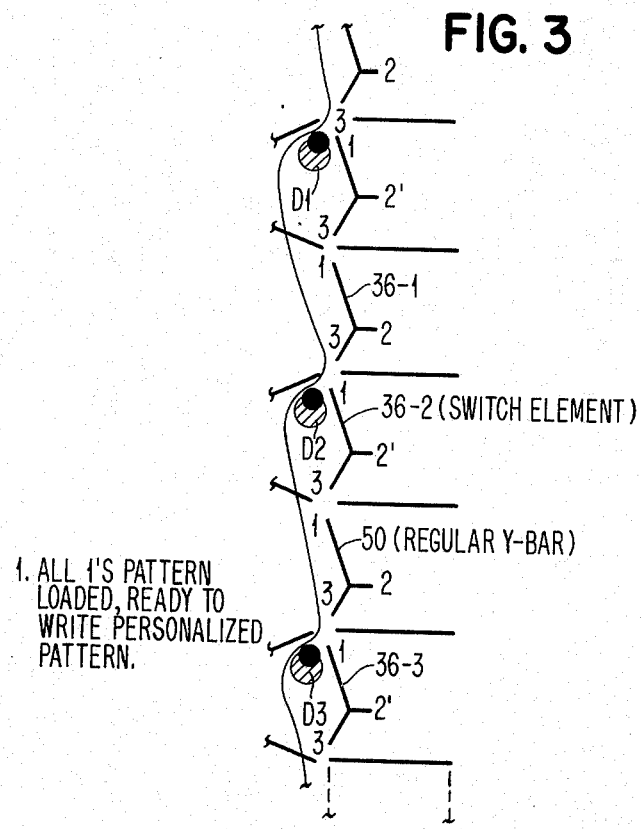
FIG. 3 illustrates each repair station loaded with a domain following testing for determining defective loops.
Figure 4:
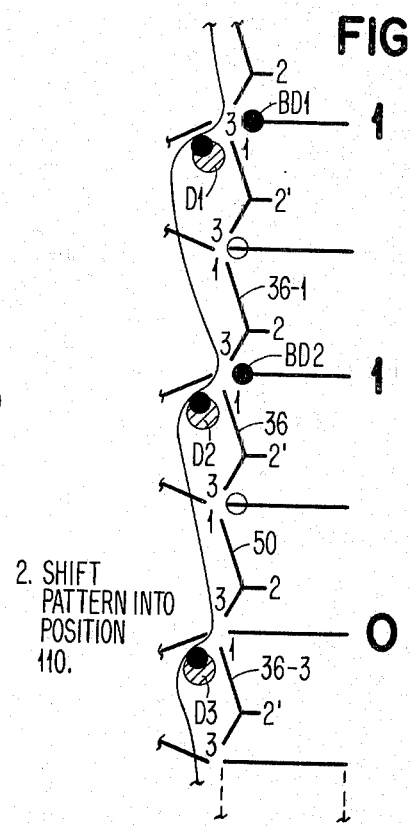
FIG. 4 illustrates a personalized pattern of domains which are to be loaded in parallel into the repair stations.
Figure 5:
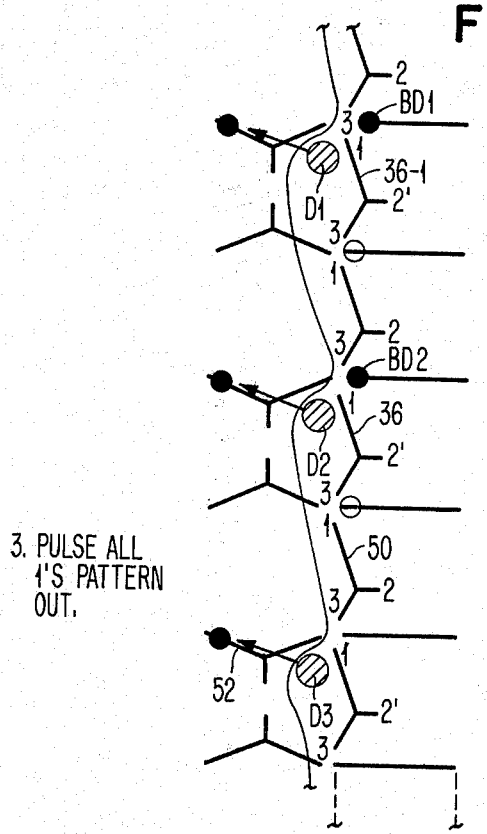
FIG. 5 illustrates the parallel shifting out of the domains from the repair stations for propagation along the loops.
Figure 6:
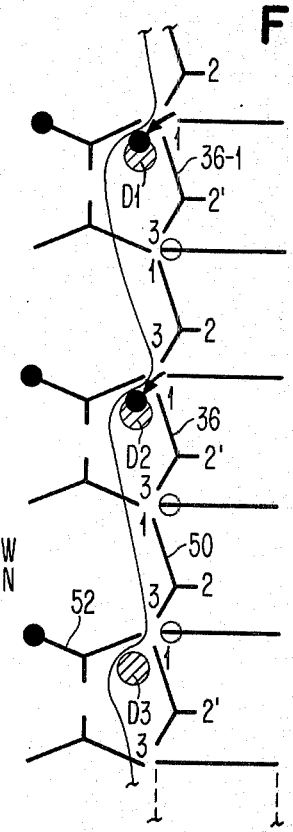
FIG. 6 illustrates the parallel loading of the personalized pattern into the repair stations for shorting out the defective loops.

The repair of defective loops on the magnetic chip will now be considered. It is to be assumed that two voids have been sensed, indicating that defects exist in loops 1 and 2 (FIGS. 1 and 2). With domains still positioned on each disc as shown in FIG. 3, a repair pattern made up of domains and voids is generated by means of generator 14 and I/O control 16. The repair pattern will be a logical compliment of the above mentioned read pattern. Considering only the first three loops, if defects exist in loops 1 and 2, the applicable emerging chain or pattern read will be 001. The repair pattern to be generated for causing the defective loops to be bypassed will therefore by 110. This pattern of two domains and a void is propagated along the shorting paths until the void is positioned one cycle before the entrance of switch S3 and the domains are positioned one cycle before the entrance of switches S1 and S2. This is illustrated in FIG. 4. A reverse current is then applied to transfer line 22 for causing the domains positioned on discs D1, D2, and D3 to be propagated in parallel along loops 1, 2, and 3, respectively. This is illustrated in FIG. 5. On the next cycle, a current pulse is applied along transfer line 22 for causing the repair pattern to be loaded in parallel. That is, the domains positioned before the entrance to switches S1 and S2 are caused to be moved to discs D1 and D2 as shown in FIG. 6. This effectively shorts out loops 1 and 2. Subsequently generated domains will then bypass these loops. The bubble domains propagating along the loops are cleared and the repaired shift register is ready for use.

The number of desired repairs to made is equal to the number of spare loops provided in the shift register. In the particular example illustrated by FIG. 1, 64 loops are used to provide a shift register of 32K bits. This means that 5 spare loops are provided. If loops 1–64 are perfect, the last 5 spare loops are purposely bypassed in the manner as described above regardless of the presence of faults in these loops. That is, a bubble domain is placed on the disc at the entrances of the spare loops so that subsequent bubble domains bypass the spare loops on their trips around the shift register.

Each repair operation introduces a delay of two extra drive field cycles. This means that the control means 30 must keep track of how many repairs have been made. In the particular example being described, five allowed repairs will mean an increase of actual shift register length of 5 × 2 bit positions so that the final shift register length is 32,010 bits, plus the bits in paths d and e. Since even a perfect chip requires that the domains bypass the redundant loops, all repaired chips and perfect chips will have the same bit length. In normal operation, after repairs have been made, it is not necessary that control means 30 or any other repair means external to the chip have knowledge of the repair pattern stored therein.

This operation of the magnetic chip is directly amenable to additional repairs at a later time. In the example illustrated, assume that the chip initially had three repaired defects. Thus, two good spare loops were sealed off in the initial diagnosis and repair procedure. Assume now that a fourth defect develops in the magnetic chip. To correct this defect, the magnetic chip is saturated by a large magnetic field perpendicular to the plane of magnetic medium 10 (which can be achieved by the bias field means 26). This will collapse all bubble domains in the chip, including those previously installed at the repair stations. At this time, the diagnosis and repair operations previously described are to be repeated. As a result, an operating chip will be obtained having four repairs therein with one good spare loop sealed off.

The diagnosis and repair procedure can easily be performed automatically under computer control. The result of this "final manufacturing step" is that a bubble domain chip having a finite number of defects is changed to a fully useable chip. This in turn results in a significant increase in the yield of large capacity bubble domain chips.

Refer again to FIG. 2. There is shown a more detailed diagram of the structural elements. These structural elements can be used to provide the propagation and switch elements for implementing a redundant magnetic chip which can be diagnosed and repaired in accordance with the principles of this invention. More specifically, FIG. 2 shows the bubble domain generator 14 together with its I/O control line 18. The read means 20 is illustratively comprised of the magnetoresistive sensing element 44. This element 44 is connected to a current source for providing a electrical current through element 44 at the time domains are to be sensed. This provides a voltage signal output $V_s$ which appears at the input of utilization means 48. Utilization means 48 can be any type of well-known circuitry, including an electronic computer. As is apparent from FIG. 2, each repair operation introduces a delay of two extra drive field cycles.

After the defective loop has been sealed, all subsequent bubble domains produced by the write means are coded and applied to the shift register 12. There is now an operational register and no further current pulses have to appear on transfer line 22.

What has been described above is a technique which uses bubble domain physics to allow diagnosis of defects and repairs on a magnetic bubble domain chip. The defects can be of any type, including defects in the magnetic material in which the bubble domains exist, and defects in the propagation structures, etc. used to manipulate bubble domains in the magnetic medium. These repairs can be accomplished while the chip is in its normal operating package. The only extra contact with the outside world is a single pair of connections to a transfer line. Accordingly, it is not necessary to access the chip with a laser beam or some other type of selective etching means. The diagnosis and repair procedure can readily be performed automatically under control of a computer. Consequently, a magnetic bubble domain chip having a finite number of defects is turned into a fully operational chip which is equivalent to a chip having no defects therein. This greatly improves the yield of magnetic bubble domain chips.

In addition, this magnetic chip has the capability of further repair should additional defects develop. Therefore, the economies provided are significantly in excess of those presently obtained with state of the art magnetic bubble domain chips.

Further, the storage means and propagation means for the bubble domains can be comprised of any type of elements and can use a variety of principle well-known in the art. Additionally, the switches can be programmable or any type which provide the functions described herein.

Although FIGS. 1 and 2 show the use of redundant shift register loops, it should be understood that a redundant return path for bubble domains can also be provided. That is, a programmable switch can be used together with an alternate return path for movement of bubble domains after passage through the various loops 1, 2, . . .

The concept presented in this description can be used with other propagation structure. For instance, defect diagnosis and repair can be done on a plurality of separate shift registers, as well as on the long register illustrated in the present description.

In the comparing the instant application with the above crossreferenced application, the time required to diagnose and repair a defective chip according to this invention is significantly less. In fact, with the above cross-referenced application, the time $T_1$ required is proportional to $H^2Lg$. With the instant application, the time $T_2$ required is proportional to $Lg$. For example:

$$T_1 = Tr[(Nb=2)Dwr+2(N+1)Drr+Dnw+(N^2-Nb-1)Lg+Nb(Nb+2)Lb+Nb], \text{ and}$$

$$T_2 = Tr[3Dwr+2Drr+2Dnw+2Lg+(4N-6)Lb+(N-3)]$$

where:

$Dwr$ = distance domain travels from writing to reading
$Drr$ = distance from reading to first repair station
$d = Dwr + Drr$
$Dnw$ = distance from last loop to writing = e
$Lg$ = distance domain travels along a non-defective loop (For example, $Lg$ is the distance a domain travels from the arrow on the bottom of path A1, through S2, and along loop 2 to the arrow on the bottom of path A2.)
$Lb$ = distance domain travels along a shorting path (For example, $Lb$ is the distance a domain travels from the arrow on the bottom of A2, though S3, and along A3.)
$N$ = total number of loops
$Nb$ = number of permitted defective loops
$Tr$ = shift or propagation rate from the above, if:

$$Lg = 500$$

$$Dwr = Drr = Dnw = Lg/2$$

$$Lb = 2$$

$$N = Lg/4$$

$$Nb = N/11 = Lg/44$$

$$Tr = 10 \text{ microseconds}$$

then;

$$T_1 = (.0625Lg^3 + .24Lg^2 + 1.61Lg)Tr$$

or approximately 79 seconds, and $$T_2 = (7.75Lg - 15)Tr$$

or approximately 0.04 seconds

Therefore, the simultaneous testing and parallel repair procedure of the instant invention provides a significant advance in terms of time.

In summary, the testing of all loops of a long serial magnetic bubble domain chip, for detecting defects, is accomplished by first sequentially generating bubble domains. Repair stations are located adjacent the entrance and exit of each loop. The bubble domains generated are loaded into each repair station for creating shorting paths between the loops. New domains are then sequentially generated and positioned adjacent each repair station. Thereafter, the domains in the repair stations are shifted out and along the loops in parallel. When shifted out, the new domains are loaded into the repair stations in parallel. The domains in the loops are shifted until they encounter the repair stations. Since the repair stations contain domains, propagation down a subsequent loop is inhibited. Thus, these domains shift down shorting paths bridging the entrance and exit of each loop, and are read or sensed. If one of the loops is defective, a void will exist and be sensed. The arrangement of domains and voids read will provide the basis for a repair pattern for repairing the chip. The repair pattern will be a logical compliment of the pattern read. The repair pattern is sequentially generated and properly positioned adjacent the loops. The domains in the repair stations are then shifted out in parallel for propagation along the loops. The repair pattern is then loaded into the repair stations in parallel for sealing off defective loops.

While the invention has been particularly shown and described with reference to a particular embodiment, it will be understood by those skilled in the art that various changes in form and detail may be made without departing from the spirit and scope of the invention.

What is claimed is:

1. A method of testing loops of a serial magnetic bubble domain chip having a propagation field applied thereto, and a repair station adjacent the entrance and exit of each of said loops, each repair station being initially loaded with a bubble domain creating shorting paths bypassing said loops, said method comprising:
    a. sequentially generating a chain of bubble domains and propagating said chain until one of said bubble domains making up said chain is positioned adjacent said entrance of each of said loops;
    b. transferring said bubble domains contained in said repair stations out of said repair stations into corresponding loops for propagation along said loops;
    c. transferring said bubble domains positioned adjacent said entrance of said loops into said repair stations for recreating said shorting paths; and
    d. reading said bubble domains that were transferred into said loops and propagated along said loops and along said shorting paths, after emergence from said loops.

2. A method according to claim 1 wherein the transferring of said bubble domains initially contained in said repair stations out of said repair stations for propagation along said loops is in parallel.

3. A method according to claim 2 wherein the transferring of said bubble domains positioned adjacent said entrance of said loops into said repair stations is in parallel for recreating said shorting paths.

4. A method according to claim 3 including determining if any of said loops are defective, and if so, which of said loops are defective upon said reading of said bubble domains.

5. A method according to claim 4 including determining a repair pattern made up of bubble domains and voids based upon said reading of said bubble domains and said determining of said defective loops, said repair pattern being a logical compliment of said bubble domains read.

6. A method according to claim 5 including a method of repairing said chip when it is determined to be defective, said method comprising:
    a. generating said repair pattern made up of bubble domains and voids and propagating said pattern into alignment with said loops such that said bubble domains included in said pattern are positioned adjacent said entrance of said defective loops;
    b. transferring said bubble domains transferred into said repair stations for recreating said shorting paths out of said repair stations for propagation along said loops; and
    c. transferring said bubble domains making up said pattern into the repair stations corresponding to said defective loops for creating shorting paths bypassing said defective loops.

7. A method according to claim 6 wherein the transferring of said bubble domains transferred into said repair stations for recreating said shorting paths out of said repair stations for propagation along said loops in parallel.

8. A method according to claim 7 wherein the transferring of said bubble domains making up said pattern into the repair stations corresponding to said defective loops is in parallel for creating shorting paths bypassing said defective loops.

9. A method according to claim 8 including clearing all bubble domains propagating along said loops from said chip.

* * * * *

UNITED STATES PATENT OFFICE
CERTIFICATE OF CORRECTION

PATENT NO. : 4,001,673

DATED : January 4, 1977

INVENTOR(S) : Gerald George Barrett, Louis Michael Hornung, Calvin Coolidge Jones, Jr.

It is certified that error appears in the above-identified patent and that said Letters Patent are hereby corrected as shown below:

In Claim 7, line 28, following "loops", insert --is--.

Signed and Sealed this

Twenty-sixth Day of April 1977

[SEAL]

Attest:

RUTH C. MASON
Attesting Officer

C. MARSHALL DANN
Commissioner of Patents and Trademarks